United States Patent
Arend et al.

(10) Patent No.: US 11,705,862 B2
(45) Date of Patent: Jul. 18, 2023

(54) METHOD FOR ENHANCING THE STARTING OF AN OSCILLATOR OF A SUPER-REGENERATIVE RECEIVER, AND RECEIVER FOR IMPLEMENTING THE METHOD

(71) Applicant: The Swatch Group Research and Development Ltd, Marin (CH)

(72) Inventors: Jean-Luc Arend, Corcelles (CH); Arnaud Casagrande, Bole (CH)

(73) Assignee: The Swatch Group Research and Develonment Ltd, Marin (CH)

( * ) Notice: Subject to any disclaimer, the term of this patent is extended or adjusted under 35 U.S.C. 154(b) by 0 days.

(21) Appl. No.: 17/855,020

(22) Filed: Jun. 30, 2022

(65) Prior Publication Data
US 2023/0099987 A1    Mar. 30, 2023

(30) Foreign Application Priority Data
Sep. 30, 2021    (EP) .................................... 21200072

(51) Int. Cl.
*H03B 5/06* (2006.01)
*H03B 5/12* (2006.01)
(Continued)

(52) U.S. Cl.
CPC ............. *H03B 5/06* (2013.01); *H03B 5/1212* (2013.01); *H03L 7/0802* (2013.01); *H03L 7/099* (2013.01)

(58) Field of Classification Search
CPC ...................................................... H03B 5/06
(Continued)

(56) References Cited

U.S. PATENT DOCUMENTS

| 6,993,315 B1* | 1/2006 | Frazier ................... B82Y 10/00 455/227 |
| 2004/0198288 A1* | 10/2004 | Sadowski .............. H03D 11/02 455/259 |

(Continued)

FOREIGN PATENT DOCUMENTS

GB    2 433 365 A    6/2007

OTHER PUBLICATIONS

Patrick Favre et al.: "A 2-V 600-A 1-GHz BiCMOS Super-Regenerative Receiver for ISM Applications", IEEE Journal of Solid-State Circuits, IEEE, USA, vol. 33, No. 12, Dec. 1998, XP011060882, ISSN: 0018-9200.
(Continued)

*Primary Examiner* — Joseph Chang
(74) *Attorney, Agent, or Firm* — Sughrue Mion, PLLC (57) ABSTRACT

A method is provided for enhancing the detection of the start time of a reference oscillator (4) of a super-regenerative receiver (1), which includes the reference oscillator, a bias current generator (7), an oscillation detector (6), and an impedance matching unit (3). Following the supply of the bias current (i_vco) after receiving the activation control signal (Sosc), an oscillation detection is performed by the oscillation detector (6), and once oscillation is detected, an additional amplification current (iboost) dependent on the envelope of the detected oscillation, of an amplification current generation circuit is supplied to the reference oscillator (4) in addition to the bias current to amplify the oscillation signal to be above a critical oscillation start threshold so as to precisely define the start time of the oscillator, and enable the oscillation detector (6) to order the stoppage of oscillation of the reference oscillator (4).

11 Claims, 3 Drawing Sheets

(51) Int. Cl.
*H03L 7/08* (2006.01)
*H03L 7/099* (2006.01)

(58) Field of Classification Search
USPC .............................................. 331/8
See application file for complete search history.

(56) References Cited

U.S. PATENT DOCUMENTS

| | | | |
|---|---|---|---|
| 2005/0069051 A1* | 3/2005 | Lourens | H03D 11/06 375/316 |
| 2010/0237935 A1 | 9/2010 | Brown et al. | |
| 2014/0027638 A1* | 1/2014 | Chang | G01S 7/285 250/338.1 |

OTHER PUBLICATIONS

European Search Report for 21 20 0072 dated Mar. 10, 2022.

\* cited by examiner

Fig. 5

METHOD FOR ENHANCING THE STARTING OF AN OSCILLATOR OF A SUPER-REGENERATIVE RECEIVER, AND RECEIVER FOR IMPLEMENTING THE METHOD

CROSS REFERENCE TO RELATED APPLICATION

The present application is based on, and claims priority from the prior European Patent Application No. 21200072.3, filed on Sep. 30, 2021, the entire contents of which are incorporated herein by reference.

TECHNICAL FIELD OF THE INVENTION

The invention relates to a method for enhancing the detection of the start time of the oscillator of a super-regenerative receiver, as well as the receiver for implementing the method.

PRIOR ART

Since the 1920s, a short-wave receiver invented by Edwin Howard Armstrong has been known, which also initially comprises three lamps, which are expensive, and its invention made it possible to reduce the operation of the receiver to one lamp. As discussed hereinafter, this principle is used by the present invention of the super-regenerative receiver to reduce the electricity consumption and simplify the architecture of said receiver.

In the patent filed in his name, U.S. Pat. No. 1,342,885 A, a method for receiving high-frequency oscillations by a short-wave receiver is described.

In a super-regenerative receiver, an LC type VCO type oscillator can be used, for example. This type of LC oscillator starts oscillating when the L and C resonator losses are compensated with the negative conductance of active devices. This limit corresponds to a minimum current also referred to as critical current of the oscillator which is required to start oscillation.

In a super-regenerative receiver, the RF signal is injected directly into the resonant coil of the oscillator. According to the frequency that is close or not to the resonance frequency of the oscillator, and the amplitude of the RF signal, the oscillator starts with more or less current and more or less time. This start current and the associated start time are detected.

To quantify this start current and the associated start time, the oscillator is triggered. An increasing current is injected into the oscillator. This current starts below the critical current and increases until the oscillator starts. The current can have for example the form of a linear ramp. The oscillator starts oscillating at a given current corresponding to a start time.

U.S. Pat. No. 5,613,231 A describes an oscillator equipped with an active component or amplifier and a reactive stabilisation component. The active component is a bipolar transistor disposed in a common base circuit, while the reactive component is a dielectric resonator entirely coupled with the transistor collector. The base of the bipolar transistor is connected to a pole of a power supply via a first resistor and to a common point via a second resistor and of which the transmitter is connected to the same pole via a third resistor. A resonator core is connected between the collector of the bipolar transistor and the common point. Nothing is described in respect of enhancing the start time of an oscillator of a super-regenerative receiver.

It should furthermore be noted that it is difficult to detect or determine exactly the start time of the reference oscillator because the oscillation amplitude is generally low on starting typically below 100 mV. Furthermore, typical CMOS technology amplitude detection circuits are not very sensitive for amplitudes below 100 mV.

Patent application US 2010/237935 A1 describes a logarithmic detector comprising an amplifier element, means for regulating an operating frequency of the detector; and a controller, wherein an input signal to the amplifier element is arranged to induce an oscillation in the amplifier element. The controller can be used to detect a predetermined threshold, indicative of an oscillation and, in response to the detection of the threshold, to interrupt the oscillation of the amplifier so that the interruption frequency is proportional to the logarithm of the power of the input signal. No super-regenerative receiver is described.

Reference is made to the article by Patrick Favre et al.: "A 2-V 600-A 1-GHz BiCMOS Super-Regenerative Receiver for ISM Applications", IEEE JOURNAL OF SOLID-STATE CIRCUITS, IEEE, USA, vol. 33, no. 12, 1 Dec. 1998, XP011060882, ISSN: 0018-9200. A super-regenerative receiver is described, which comprises a bias current generator for supplying a bias current to a reference oscillator on receiving a first activation control signal, an oscillation detector connected between an input and an output of the reference oscillator and the bias current generator for detecting an oscillation in the reference oscillator. An additional amplification current generation circuit for supplying an additional amplification current to the reference oscillator in addition to the conventional bias current is also provided. This additional amplification current is supplied to the reference oscillator in addition to the conventional bias current to amplify the oscillation signal in order to be above a critical oscillation start threshold to define the start time of the oscillator and until the detector is allowed to order the stoppage of the reference oscillator. However, a progressive increase in the bias current to better define the start time is not provided, which is a drawback.

Patent application GB 2 433 365 A describes a super-regenerative receiver which comprises a reference oscillator powered by polarisation currents from the activation of the oscillator and a pulse width controller. The oscillator remains active up to a certain oscillation level before being deactivated. No progressive increase in the bias current is performed to better define the start time, which is a drawback.

SUMMARY OF THE INVENTION

The aim of the invention is therefore that of providing a method for enhancing the detection of the starting of an oscillator of a super-regenerative receiver for receiving one or more RF signals, by overcoming the abovementioned drawbacks of the prior art while making it possible to reduce the electricity consumption for the operation thereof. Furthermore, the receiver is capable of implementing the method for enhancing the starting of the oscillator of the receiver.

To this end, the invention relates to a method for enhancing the starting of an oscillator of a super-regenerative receiver, which comprises the features defined in independent claim 1.

Specific steps of the method are defined in dependent claims 2 to 7.

An advantage of the method for enhancing the detection of the starting of an oscillator of a super-regenerative receiver lies in that it makes it possible to provide a better transition between the idle and active state of the oscillator of the receiver around a well-determined start time, which is proportional to the amplitude and frequency of the RF signal detected. To do this following an increasing bias current and particularly on passing a first low voltage threshold corresponding to a critical oscillation start bias current, the oscillator is additionally supplied with an additional amplification current, at least from the start of the oscillation detected. This also makes it possible to determine exactly the start time of the oscillator, because without this additional amplification current (defined as "boost" current), it is difficult to precisely determine this start time, which is dependent on the RF signal detected.

Advantageously, once the oscillation is detected, it can be envisaged to cut off the bias current as well as the additional amplification current in order to reduce the electricity consumption of the receiver. Several successive cycles spaced out over time for supplying bias current from a bias current generator are generally provided, making it possible to measure the progression of the RF signal.

Advantageously, a circuit for generating an amplification current is provided in addition to the bias current generator of the oscillator. This amplification current generation circuit can be adapted to supply an additional amplification current to the oscillator from the start of the oscillation detected at the first low voltage threshold. Thanks to this, it is possible to rapidly cut off the bias current and the additional amplification current for the oscillator on detecting the oscillation to reduce the electricity consumption of the receiver circuit. This amplification current can be constant above the low voltage threshold, to rapidly supply an additional amplification current to clearly determine the oscillation start time of the oscillator without being influenced by any oscillator signal amplitude variation noise.

The reference oscillator of the receiver is preferably a high-frequency operation VCO type oscillator corresponding to the frequency of an RF signal detected by the receiver. To reduce consumption, the reference oscillator must in principle be stopped just after determining the oscillation start time of the oscillator. This VCO type oscillator is preferably an LC oscillator composed essentially of an inductance and a condenser in parallel.

Advantageously, the external RF signal, which is collected by the receiver antenna, is carried directly on the resonant circuit of the oscillator, thus creating an initial oscillation condition more or less favourable for the more or less rapid starting of the oscillator. Furthermore, the start time subsequently determined is directly dependent on the RF signal detected.

To this end, the invention also relates to a super-regenerative receiver for implementing the method, which comprises the features defined in independent claim 8.

Specific embodiments of the receiver are defined in dependent claims 9 to 13.

BRIEF DESCRIPTION OF THE FIGURES

The aims, advantages and features of the method for enhancing the starting of a reference oscillator of a super-regenerative receiver will emerge more clearly in the following description based on non-limiting embodiments and illustrated by the drawings wherein.

DETAILED DESCRIPTION OF THE INVENTION

In the following description, reference is made to a method for enhancing the precision for detecting starting of the oscillator of a super-regenerative receiver with a reduction in electricity consumption. Obviously all the components used in the receiver, which are well-known in the technical field, will only be described in a simplified manner. Reference is essentially made to enhancing the precision for detecting the starting of the reference oscillator, which can be a VCO oscillator for example of LC type.

Figure 1:
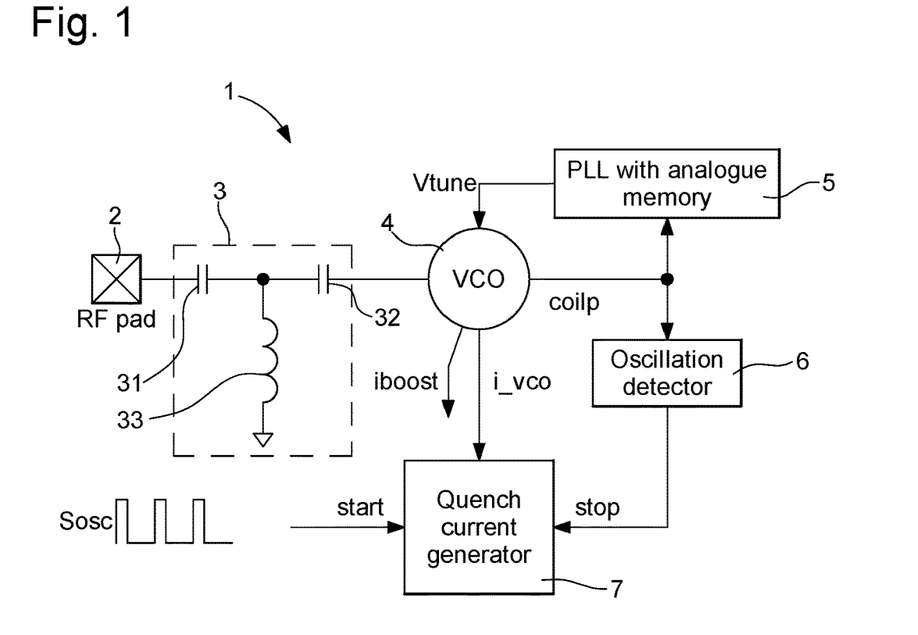
FIG. 1 represents, in a simplified manner, a first embodiment of a super-regenerative receiver with a set of electronic components for detecting the presence of an RF signal at the input and enhancing the detection of the starting of oscillation of the oscillator according to the present invention.

FIG. 1 represents comprehensively a first embodiment of an RF signal receiver 1 arranged to enhance the precision for detecting the start time of a reference oscillator 4 particularly following the detection of receiving at least one RF signal. The start time is directly dependent on the RF signal detected by the receiver. For this, the receiver 1 firstly comprises an input terminal or pad 2 for receiving an RF signal. The receiver 1 comprises a reference oscillator 4 for generating an oscillation in the oscillator, a bias current generator 7 for supplying a bias current i_vco to the reference oscillator 4. The bias current i_vco is supplied to the reference oscillator 4 particularly after receiving at least one activation control signal, i.e. start signal. Preferably, a cycle of activation control signals Sosc spaced apart over time is provided for the bias current generator 7.

The super-regenerative receiver 1 further comprises an oscillation detector 6, which is connected between an output coilp of the reference oscillator 4 and the bias current generator 7 so as to control the generator 7 particularly after an RF signal is received by the receiver 1, and an oscillation of the oscillator is detected. An impedance matching unit 3 of the receiver 1 is disposed between the terminal or pad 2 for receiving the receiver 1 and the reference oscillator 4.

The receiver 1 further comprises a circuit for generating an additional amplification current iboost not shown in FIG. 1. The additional amplification current iboost is supplied in addition to the bias current i_vco to the oscillator to enhance the detection of the start time of the oscillator. The additional amplification current iboost is generated and supplied to the oscillator preferably on detecting a first oscillation of the oscillator so as to stop the oscillator from the start of oscillation in the reference oscillator 4 but at least after supplying this additional amplification current iboost. This also makes it possible to clearly define the start time of the oscillation of the reference oscillator 4 as the additional amplification current iboost is greater in value preferably than the bias current i_vco. After supplying this additional amplification current iboost and having detected the oscillation of the oscillator, a rapid cut-off of the bias current i_vco and the additional amplification current iboost occurs. This makes it possible to reduce the electricity consumption directly and rapidly with respect to a conventional receiver. It should be noted that the additional amplification current generator can be activated from the first detection of oscillation of the oscillator by the oscillation detector. Once the additional amplification current has been supplied to the reference oscillator, the start time is well defined and the oscillation is well established. This makes it possible to order the complete stoppage of the oscillation by deactivating the bias current generator, as well as the additional amplification current generation circuit.

This start time is dependent on at least one RF signal detected by the receiver. Any information linked with the RF signal received makes it possible to determine the start time precisely.

It should be noted that the additional amplification current generator can be activated from the first detection of oscillation of the oscillator by the oscillation detector 6. Once the additional amplification current has been supplied to the reference oscillator 4, the start time is well defined and the oscillation is well established. This makes it possible to order the complete stoppage of the oscillation by deactivating the bias current generator 7, as well as the additional amplification current generation circuit.

Obviously for the super-regenerative receiver 1, a unit for processing all the signals, which can comprise a processor timed by another oscillator or a microprocessor, must be provided in the receiver. Control signals of the different electronic components of the receiver can be transmitted by the processing unit not shown. The processing unit can account for the reception of a first RF signal to order the activation of the bias current generator. The processing unit can also be used for supplying at least one activation control signal to activate the bias current generator 7 and also for activating the additional amplification current generation circuit iboost from the start of a detected oscillation.

In the cycle of control signals Sosc, there is firstly a first control signal start for supplying a polarisation command of the reference oscillator 4. From this time, following the activation control signal start of the bias current generator 7, the bias current i_vco increases for example linearly until a critical value of the bias current is obtained from which the reference oscillator 4 can start oscillating for example at a high frequency of the order of 2.4 GHz. The envelope of this high-frequency signal can be taken into account for oscillation detection. From this oscillation time of the reference oscillator 4, a detection is performed in the oscillation detector 6, which is connected at least to the bias current generator 7, as well as to the circuit for generating additional amplification current iboost either directly, or by means of the bias current generator 7. Once oscillation has been detected and after supplying the additional amplification current iboost, a stop signal stop is supplied to the bias current generator 7, as well as to the additional current generation circuit to immediately stop the oscillation of the reference oscillator 4. This is the aim sought by the present invention, of thus completely stopping the supply of the bias current and the additional amplification current supplied to the reference oscillator 4 once oscillation of the reference oscillator 4 has been detected. A reduction in electricity consumption is thus obtained by immediately stopping the supply of the bias current i_vco and additional amplification current iboost to the oscillator 4 once oscillation has been detected. The oscillator immediately stops oscillating after the stop command stop supplied by the oscillation detector 6 to the bias current generator 7 and to the additional amplification current generation circuit discussed with reference to FIG. 3 hereinafter.

In a conventional scenario, the envelope of the high-frequency signal created by the oscillator increases slowly on starting following the supply of the bias current i_vco, and it becomes difficult to precisely detect the start time by observing the envelope of the high-frequency signal, because a slight modification of the envelope voltage detected in the vicinity of a given threshold can easily be induced by the ambient noise (noise present in all the active components of the oscillator and the amplitude detector).

According to the present invention, it can be provided to generate an additional amplification current iboost dependent on the envelope detected and send this current directly to the polarisation of the oscillator with the bias current i_vco, thus creating positive feedback. This positive feedback enables the oscillator to rapidly increase the envelope of the oscillating signal (once an oscillating signal starts to exist) and thus carry the envelope detection signal much more rapidly with a much more pronounced slope through a given threshold corresponding to the critical oscillation start current threshold.

The oscillation detector 6 will take into account the detection of oscillation after supplying the additional amplification current iboost for which the envelope of the second oscillation signal is well above the oscillation start threshold. Following this detection by the oscillation detector 6 with a well-defined start time, a stop signal is sent to the bias current generator 7 as well as to the circuit for generating the additional amplification current iboost. For the oscillation detector 6, a first oscillation detection can be provided to enable the additional amplification current generation circuit to be activated and to supply the additional amplification current to the oscillator. Finally, the oscillation detector supplies a stop control signal after the second detection of oscillation with amplification of the oscillating signal.

As explained hereinafter with reference to FIG. 3, the additional amplification current generation circuit can according to an alternative embodiment be integrated in the bias current generator 7. However, it can also be provided to have an additional amplification current generation circuit outside the bias current generator. Under these conditions, the additional amplification current generation circuit can be controlled by the oscillation detector 6 directly for the supply of the additional amplification current iboost particularly from the start of the oscillation detected.

Figure 2:
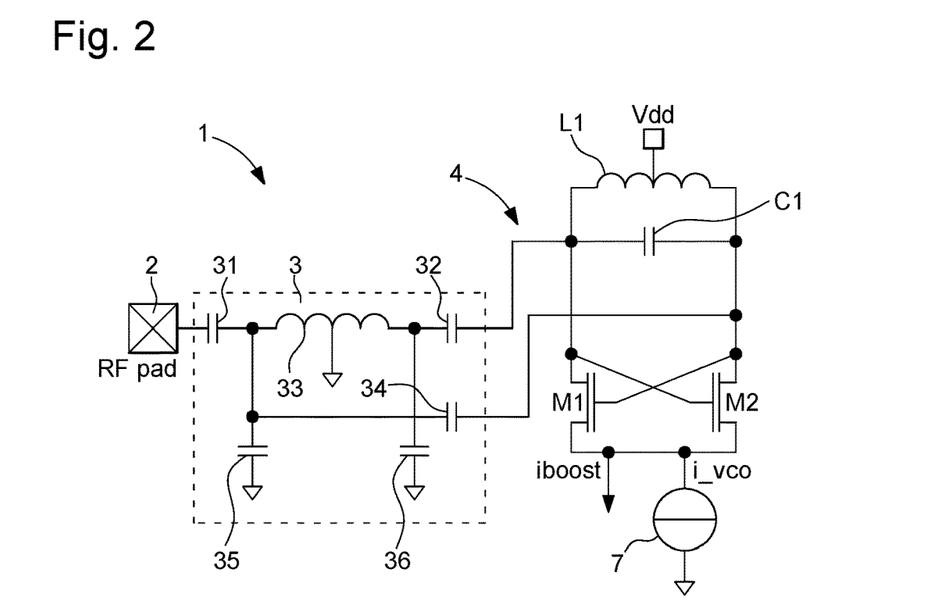
FIG. 2 represents a second simplified embodiment of the RF signal receiver adapted to enhance the detection of the start time of a reference oscillator such as a voltage-tuned VCO with a bias current for generating an oscillation of the oscillator and an additional amplification current according to the present invention.

Preferably, the reference oscillator 4 is an LC type VCO voltage-controlled oscillator, which comprises in parallel at least one inductance L1 and one condenser C1. In the configuration shown in FIG. 1, the inductance L1 is separated into two inductances connected to one another and of which the connection of the two inductance parts is powered by a tuning voltage Vdd. The inductance defines an oscillating circuit, of which the resonance frequency is adjusted using a variable capacitance (not shown in FIG. 2), which is controlled by a voltage Vtune. To do this, the receiver 1 further comprises a PLL phase lock loop 5 dependent on an external frequency reference (not shown in FIG. 1) and connected between the output coilp of the VCO oscillator 4 and the control voltage of the variable capacitance (Vtune). The tuning voltage Vtune at the output of the PLL loop 5 is a control voltage of the oscillation frequency of the VCO voltage-controlled oscillator 4. The PLL loop 5 can comprise an analogue memory to store the voltage Vtune in memory. Obviously, as the oscillator acts in differential mode, the output terminal coiln not shown can also be used instead of the output terminal coilp of the reference oscillator 4. In this scenario as shown in FIG. 2, the terminal coiln, not shown, is the input of the reference oscillator 4 connected by the impedance matching unit 3 to the terminal or pad 2 of the RF signal receiver 1.

As represented in FIG. 1, the impedance matching unit 3 is used to tune the RF radiofrequency signal received by the receiver 1 before entering the reference oscillator 4 which is preferably a VCO oscillator. This impedance matching unit 3 first comprises a first condenser 31 connected, on one hand, to the input terminal or pad 2 of the RF signal and, on the other, connected to a second condenser 32 the other end of which is connected to the input of the reference oscillator 4 which is the VCO oscillator. The impedance matching unit 3 further comprises an inductance 33, which is on one hand connected to the connection of the two condensers 31, 32 and on the other to the ground.

Figure 3:
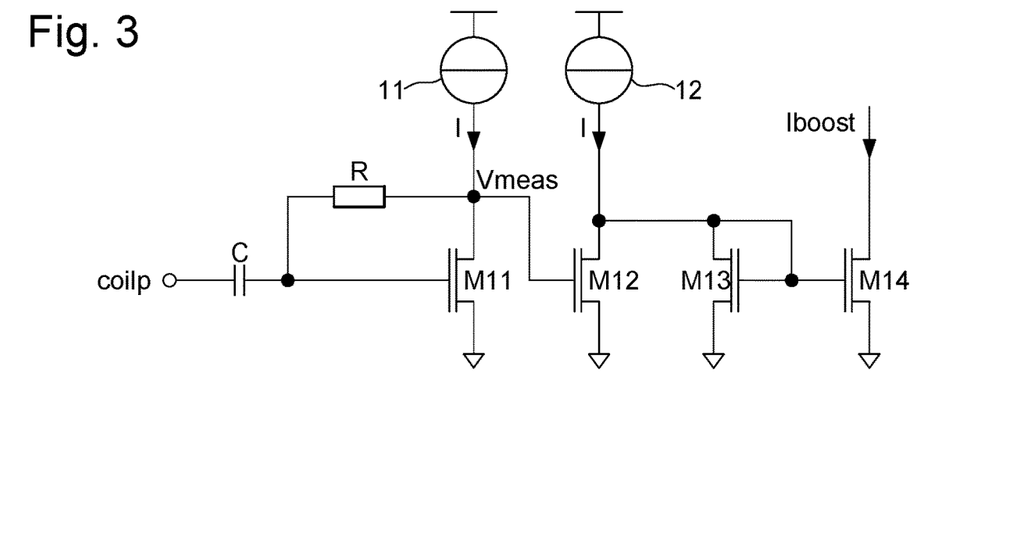
FIG. 3 represents a third simplified embodiment of a circuit for generating an additional amplification current to be supplied preferably to the oscillator at the start of oscillation for the super-regenerative receiver, and where the input of this circuit is directly connected to an output terminal of the reference oscillator represented in FIGS. 1 and 2.

FIG. 3 represents an embodiment of the circuit for generating additional amplification current iboost to be supplied to the reference oscillator 4, which can be a VCO oscillator in addition to a bias current in an operating mode of the oscillator. Preferably, the circuit for generating additional amplification current iboost comprises a first detection stage M11, M12 connected to a current mirror M13, M14 for supplying the additional amplification current iboost for the oscillator. As described hereinafter, such a circuit for generating additional amplification current can be even simpler than that already shown in FIG. 3.

The different stages M11, M12 and M13, M14 are composed for example of CMOS technology transistors. In the configuration shown in FIG. 3, the first detection stage M11, M12 is composed of two NMOS transistors M11, M12. These two transistors M11, M12 are for example two identical NMOS transistors of the same size polarised in weak inversion. The current mirror M13, M14 is composed of two NMOS transistors M13, M14. These two transistors M13, M14 are for example two NMOS transistors polarised in strong inversion.

The first transistor M11 of the first detection stage has a gate terminal connected to the signal coilp of the oscillator 4 in FIG. 1 by means of an input condenser C. The source terminal of the first transistor M11 of the first detection stage is connected to the ground terminal at 0 V, while the drain terminal of the transistor M11 is connected by means of an input resistor R to the gate terminal thereof and to a first current source 11 connected to a power supply voltage Vdd and supplying a current I for the first transistor M11. At the time of engagement of the receiver and the bias current generator is relatively low, the voltage increases very gently before reaching the critical threshold so that the oscillation starts in the oscillator.

The current of the first current source 11 polarises the NMOS transistor M11 in a non-linear amplitude detection mode, and the voltage Vmeas decreases as the amplitude of the oscillating signal coilb increases. The gate terminal of the NMOS transistor M12 is connected to this voltage Vmeas and has the effect of entirely diverting the current from the second current source 12 (slightly lower than the source 11) to the ground. When the amplitude of the signal coilb increases, the voltage Vmeas detected decreases and the current from the source 12 is progressively sent to the current mirror composed of the NMOS transistors M13, M14 which then determines an increasing current Iboost. Preferably, the current source 11 is adjusted to supply a slightly greater current than that of the source 12. To control the current mirror M13, M14, the drain terminal of the second NMOS transistor M12 of the amplitude detector is connected to the drain terminal and to the gate terminal of the first NMOS transistor M13 of the current mirror, while the source terminal of the first NMOS transistor M13 of the current mirror is connected to the ground at 0 V. The second NMOS transistor M14 of the current mirror has the gate terminal thereof connected to the gate terminal and to the drain terminal of the first NMOS transistor M13 of the current mirror. The source terminal of the second NMOS transistor M14 is connected to the ground at 0 V, while the drain terminal of the second transistor M14 of the current mirror supplies the additional amplification current iboost for the reference oscillator.

Other embodiments of the additional amplification current generation circuit taking as an example the embodiment described above with reference to FIG. 3.

To be able to describe the method for enhancing the starting of the reference oscillator of the receiver, there are different signals for starting up the receiver 1 particularly on receiving an RF signal, which are described in brief. It is also specified that the super-regenerative receiver 1 is preferably a wake-up receiver, which must be continually operating but with very short periods over time as defined in the cycle of the control signals Sosc described in FIG. 1, which are several successive start control signals start supplied over time to the bias current generator 7 to engage it or activate it.

In the case of a VCO oscillator which is of the LC type. This oscillator is provided to be frequently in a triggered state and is arranged to start very frequently over short periods and very rapidly at high-frequency operation for example at 2.4 GHz. The VCO oscillator can be engaged rapidly over short periods to react with few components on key elements of the oscillation which must be started rapidly. It is possible that the activation control signal Sosc (start) where the oscillation starts over a period of 1 µs and that over one second, there are approximately 1000 Sosc activation or engagement control periods of the VCO oscillator 4. This means that the receiver 1 is only fully engaged for 1 ms out of one second, which reduces the electricity consumption substantially and which is sought. As explained above following a first start control signal start supplied to the bias current generator 7, a linear growth of the bias current value occurs until a critical bias current value is attained, but relatively slowly. Once the critical value current is attained, the VCO reference oscillator 4 starts oscillating, which is detected directly by the oscillation detector 6 which sends an oscillation stop control signal stop to the bias current generator 7. The oscillation of the VCO reference oscillator is cancelled, which means that an RF signal has indeed been detected and while ensuring a significant reduction of electricity consumption of the receiver 1 with respect to what is known in the prior art.

Obviously, the frequency of occurrence of these start control signals Sosc start for the bias current generator 7, can be modified manually or automatically to adapt to the conditions of the reference oscillator 4.

It should furthermore be noted that in an initial frequency centring mode, the VCO oscillator is started in a loop of this type in order to determine a voltage such as the voltage Vtune corresponding to the reception frequency particularly in a conventional frequency synthesiser. Then, the voltage is saved in memory by a DAC and the synthesiser is deactivated. The VCO oscillator 4 is switched off and the RF signal can be sent for example via the tuning network 3 to the oscillating circuit of the VCO oscillator 4 in order to perform demodulation by super-regeneration. The measurement of the start time of the VCO is in the presence of a ramp of the bias current thereof. Thus, it is possible not to lower the frequency for the demodulation in this super-regenerative receiver.

Figure 4:
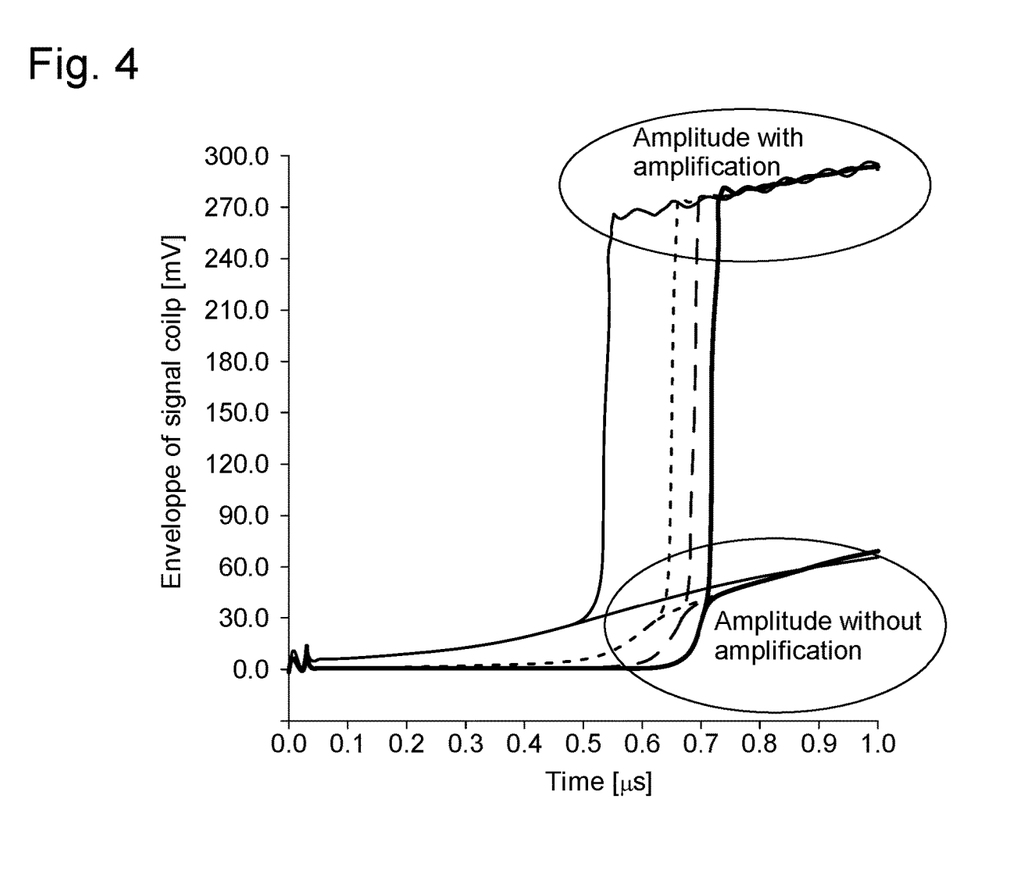
FIG. 4 represents the progression over time of the amplitude of the output signal of the reference oscillator on starting for different amplitudes of the RF signal present on the input RF pad represented in FIGS. 1 and 2 and showing the difference with or without the addition of an additional amplification current at the time of activation of the receiver and the bias current generator.

Such a frequency synthesiser, which comprises the VCO oscillator, was described in the patent application EP 3 573 241 A1 with reference to FIG. 4 in the description. If such a frequency synthesiser is used for centring frequencies of the VCO oscillator of the present invention, this patent application is incorporated here by reference.

The super-regenerative receiver will now be described further with reference to FIG. 2 or of other embodiments.

FIG. 2 represents a second embodiment of the receiver only showing the input 2 of the receiver, the impedance matching unit 3 and the reference oscillator 4, which is here a VCO oscillator 4. In this FIG. 2, the oscillation detector and the PLL phase lock loop are not shown but as above they act at the same point of the receiver. The VCO oscillator is composed of a first inductance L1 and a condenser C1 connected in parallel to the inductance L1. As above, the inductance L1 is separated into two inductances connected to one another and of which the connection of the two inductance parts is powered by a power supply voltage Vdd. The VCO oscillator 4 furthermore comprises at the bottom at a first connection end of the inductance L1 and the condenser C1, a first transistor M1, which is preferably a MOS transistor, for example in this configuration a NMOS transistor, and at a second connection end of the inductance L1 and the condenser C1, a second transistor M2 of the same type as the first transistor, for example a NMOS transistor. The drain terminal of the first transistor M1 is connected to the first connection end of the inductance L1 and the condenser C1, while the drain terminal of the second transistor M2 is connected to the second connection end of the inductance L1 and the condenser C1. The gate of the first transistor M1 is connected to the drain of the second transistor M2, while the gate of the second transistor M2 is connected to the drain of the first transistor M1. The two sources of the two transistors M1 and M2 are connected to receive the bias current from the bias current generator 7. The output coilp of the VCO oscillator can be supplied by the drain of the second transistor M2.

The impedance matching unit 3 comprises a first condenser 31 connected on a first side to the input terminal or pad 2 of the receiver 1, while a second side of the first condenser 31 is connected to a first end of an additional inductance 33, of which a second end of the additional inductance is connected to a first side of a second condenser 32. The additional inductance 33 is separated into two inductances connected to one another and of which the connection of the two inductance parts can be connected to the ground. The connection of the first condenser 31 and the additional inductance 33 is furthermore connected to a first side of a third condenser 34 and to a first side of a fourth condenser 35 of which the second side is connected to the ground. A first side of a fifth condenser 36 is connected to the connection of the second condenser 32 and the additional inductance 33. The second side of the fifth condenser 36 is connected to the ground.

A second side of the second condenser 32 is connected to the first end of the inductance L1 and the condenser C1 and also to the gate of the second transistor M2 and to the drain of the first transistor M1. A second side of the third condenser 34 is connected to the second end of the inductance L1 and the condenser C1 and also to the gate of the first transistor M1 and to the drain of the second transistor M2. The frequency tuning voltage can be applied to the first end or to the second connection end of the inductance L1 with the condenser C1.

As stated above, a reference oscillator 4 other than a conventional VCO oscillator can be used provided that it can operate at high frequency for example around 2.4 GHz.

FIG. 4 represents different values of the envelope coilp for different amplitude values of the RF signal applied on the input of the receiver, and showing the difference with or without the addition of an additional amplification current at the time of activation of the receiver and the bias current generator. As can be seen in FIG. 4, the signal s1 is that represented with a solid line and with an RF signal input value at −30 dBm. The signal s2 is that represented with a short-dotted line and with an RF signal input value at −40 dBm. The signal s3 is that represented with a long-dashed line and with an RF signal input value at −50 dBm. Finally, the signal s4 is that represented with a solid bold line and with an RF signal input value at −60 dBm.

In this FIG. 4, the difference from the application of an additional amplification current iboost dependent on the amplitude envelope of the signal coilp, added to the conventional bias current i_vco so as to clearly determine the start time of the oscillator is clearly seen. Adding this additional amplification current iboost makes it possible to obtain a better detection of oscillation of the reference oscillator 4. The voltage on the gates of the transistors M13, M14 of the current mirror passes rapidly above the threshold voltage. This makes it possible to obtain oscillation of the oscillator more rapidly to precisely detect the start time of the oscillator detected by the oscillation detector.

Different envelopes of the signal coilp are represented in FIG. 4, which correspond to different levels of the RF signal present on the input of the receiver. The relatively small increase of the envelope of the oscillating signal coilp if only the bias current is supplied to the oscillator is clearly seen. For ambient noise reasons, the detection of transition of the envelope of coilb above a given threshold is difficult to detect only using the bias current. For this reason, an additional amplification current is added for a more rapid start of the oscillation of the oscillator and this is the case for the 4 signals s1, s2, s3, s4 represented with or without amplification.

Figure 5:
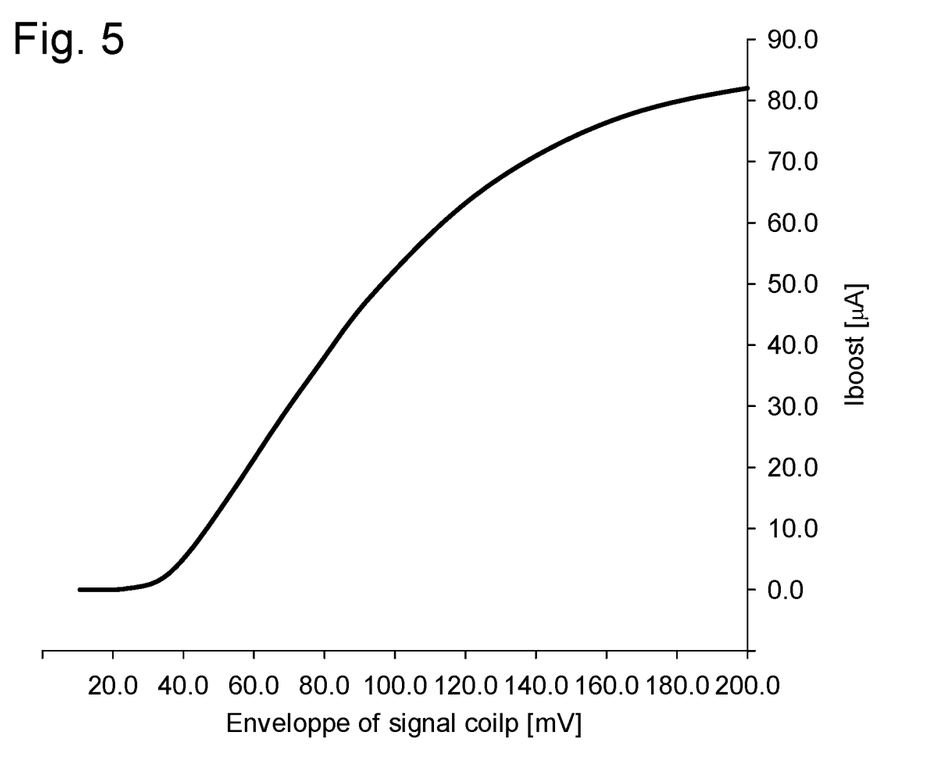
FIG. 5 represents the additional amplification current for the VCO oscillator as a function of the amplitude of the output signal, where this current increases rapidly beyond a certain amplitude of the output signal, which makes it possible to increase the growth of the output signal notably through positive feedback, and this more rapid amplitude growth making it possible to detect the oscillation start time of the oscillator more easily.

FIG. 5 represents the additional amplification current for the VCO oscillator and also the amplitude, which increases rapidly once a given threshold is attained, this greater amplitude making it possible to detect the start time of the oscillation of the oscillator more easily. This is due to the positive feedback, the additional amplification current and also the amplitude increases rapidly once the threshold is attained. This greater amplitude makes it possible to detect the start time more easily, which is sought.

Based on the description above, several alternative embodiments of the method for enhancing the start of a reference oscillator of a super-regenerative receiver can be devised without leaving the scope defined by the claims.

What is claimed is:

1. A method for enhancing the detection of the start time of a reference oscillator (4) of a super-regenerative receiver (1), the receiver (1) comprising the reference oscillator (4), a bias current generator (7) for supplying a bias current (i_vco) to the reference oscillator (4) on receiving an activation control signal (Sosc), an oscillation detector (6) for detecting an oscillation in the reference oscillator (4), and an impedance matching unit (3) disposed between a terminal or pad (2) for receiving an RF signal of the receiver (1) and the reference oscillator (4), the method comprising:

following the supply of the bias current (i_vco) after receiving the activation control signal (Sosc), the oscillation detector (6) detecting a first oscillation of the reference oscillator (4) to enable an additional amplification generation circuit to be activated and supply an additional amplification current dependent on an envelope of the oscillation detected at the oscillator, and the oscillation detector (6) supplying a stop control signal of the reference oscillator (4) after the second detection of oscillation with amplification of the oscillating signal, wherein at the activation control signal (Sosc) supplied to the bias current generator (7), a bias current which increases progressively until at least one critical current value is attained, from which the oscillation of the reference oscillator (4) starts, wherein the oscillation detector (6) detects the first oscillation of the reference oscillator (4), and wherein at the second oscillation detected by the oscillation detector (6) a stop control signal (stop) is supplied to the bias current generator (7), as well as the additional amplification current generation circuit for immediately cutting off the supply of the currents to the reference oscillator (4) and thus reduce the electricity consumption of the receiver.

2. The method according to claim 1, wherein the bias current (i_vco) is supplied to the reference oscillator (4) after receiving each activation control signal (Sosc) over the time of a cycle of activation control signals (Sosc) of the bias current generator (7).

3. The method according to claim 2, wherein the activation control signal (Sosc) starts over a period of 1 μs and over one second, close to 1000 activation control periods (Sosc) of a cycle of successive control signals (Sosc) can be counted such that the receiver (1) is only fully engaged for 1 ms out of one second.

4. The method according to claim 1, for which the receiver (1) further comprises a PLL phase lock loop (5), wherein over time, a tuning voltage (Vtune) is supplied to the reference oscillator, which is a VCO oscillator (4) for tuning the oscillation frequency.

5. The method according to claim 1, wherein the bias current generator (7) is activated by the activation control signal after receiving an RF signal.

6. A super-regenerative receiver (1) for implementing the method for enhancing the detection of the start time of the reference oscillator (4) of the super-regenerative receiver (1) according to claim 1, the receiver comprising the reference oscillator (4), the current generator (7) for supplying the bias current (i_vco) to the reference oscillator (4) on receiving the activation control signal (Sosc), the oscillation detector (6) for detecting an oscillation in the reference oscillator (4), and the impedance matching unit (3) disposed between the terminal or pad (2) for receiving the RF signal of the receiver (1) and the reference oscillator (4), the receiver (1) comprising the additional amplification current generation circuit for supplying the additional amplification current (iboost) to the reference oscillator (4) in addition to the bias current after the first oscillation detected by the oscillation detector (6), the additional amplification current (iboost) being supplied to the reference oscillator (4) in addition to the bias current to amplify the oscillation signal to be above a critical oscillation start threshold so as to precisely define the start time of the oscillator, and enable the oscillation detector (6) to order the stoppage of the reference oscillator (4) during the second oscillation detected by the oscillation detector (6).

7. The super-regenerative receiver (1) according to claim 6, further comprising a PLL phase lock loop (5) for supplying a tuning voltage (Vtune) to the reference oscillator which is a VCO oscillator (4).

8. The super-regenerative receiver (1) according to claim 6, wherein the reference oscillator (4) operates at a frequency equal to or greater than 2.4 GHz and without lowering frequencies for demodulation operations.

9. The super-regenerative receiver (1) according to claim 6, wherein the additional amplification current generation circuit comprises at least one current mirror composed of a first NMOS type transistor (M13) and a second NMOS type transistor (14), the first NMOS transistor (M13) having the terminal thereof connected to the ground and the gate terminal and drain terminal connected together to be connected to a second current source (12), the second NMOS transistor (M14) having the gate terminal thereof connected to the gate terminal of the first NMOS transistor (M13), the source terminal thereof connected to the ground and the drain terminal supplying the additional amplification current (iboost) to the reference oscillator (4).

10. The super-regenerative receiver (1) according to claim 9, wherein the additional amplification current generation circuit intended to be activated after detecting the first oscillation comprises an amplitude detector (M11, M12) connected to the current mirror (M13, M14) for supplying the additional amplification current (iboost) for the reference oscillator (4), the first amplitude detector comprising a first NMOS transistor (M11) and a second NMOS transistor (M12), the first NMOS transistor (M11) being connected identically to the first NMOS transistor (M13) of the current mirror while being connected to a first current source (11), and the second NMOS transistor (M12), the drain terminal of the second NMOS transistor (M12) being connected to the gate and to the drain of the first NMOS transistor (13) of the current mirror.

11. The super-regenerative receiver (1) according to claim 10, wherein the NMOS transistors (M11, M12) of the amplitude detector are of the same size and polarised in weak inversion, while the NMOS transistors (M13, M14) of the current mirror are two NMOS transistors polarised in strong inversion.

* * * * *